United States Patent
Moehlmann

(10) Patent No.: US 10,382,045 B2
(45) Date of Patent: Aug. 13, 2019

(54) DIGITAL PHASE LOCKED LOOPS

(71) Applicant: NXP B.V.

(72) Inventor: Ulrich Moehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 398 days.

(21) Appl. No.: 15/377,917

(22) Filed: Dec. 13, 2016

(65) Prior Publication Data

US 2017/0194973 A1    Jul. 6, 2017

(30) Foreign Application Priority Data

Jan. 6, 2016  (EP) .................................... 16150342

(51) Int. Cl.
| | |
|---|---|
| H03L 7/099 | (2006.01) |
| G01S 7/35 | (2006.01) |
| H03L 7/093 | (2006.01) |
| H03L 7/12 | (2006.01) |

(52) U.S. Cl.
CPC .............. *H03L 7/0991* (2013.01); *G01S 7/35* (2013.01); *H03L 7/093* (2013.01); *H03L 7/099* (2013.01); *H03L 7/12* (2013.01); *H03L 2207/06* (2013.01); *H03L 2207/50* (2013.01)

(58) Field of Classification Search
CPC ... G01S 7/35; H03L 2207/06; H03L 2207/50; H03L 7/093; H03L 7/099; H03L 7/0991; H03L 7/12
USPC ........................................................ 342/200
See application file for complete search history.

(56) References Cited

U.S. PATENT DOCUMENTS

| | | | | |
|---|---|---|---|---|
| 6,384,770 | B1 | 5/2002 | de Gouy et al. | |
| 8,384,488 | B2 * | 2/2013 | Mendel | H03L 7/0991 |
| | | | | 331/1 A |
| 8,564,340 | B2 * | 10/2013 | Liu | H03L 7/093 |
| | | | | 327/147 |
| 2004/0109521 | A1 * | 6/2004 | Jeong | H03L 7/0898 |
| | | | | 375/376 |

(Continued)

OTHER PUBLICATIONS

Chaivipas, W. et al. "Analysis and Design of Direct Reference Feed-Forward Compensation for Fast-Settling All-Digital Phase-Locked Loop", IEICE Trans. Electron., vol. E90-C, No. 4, pp. 793-801 (Apr. 2007).

Zhang, W. et al. "A Novel Fast-Settling ADPLL Architecture with Frequency Tuning Word Presetting and Calibration", IEEE 8th International Conference on ASIC, pp. 1161-1164 (Oct. 2009).

(Continued)

*Primary Examiner* — Timothy X Pham
(74) *Attorney, Agent, or Firm* — Rajeev Madnawat

(57) ABSTRACT

An all digital phase locked loop system for tracking a variable frequency input signal and method of operation are described. The ADPLL system includes a digital phase locked loop, including a digitally controlled oscillator, and a model of the digitally controller oscillator. The model represents the behaviour of the digitally controlled oscillator as a function of frequency and has a model input arranged to receive a signal indicating a current target frequency. The model is configured to output at least one control signal to control the frequency of the digitally controlled oscillator to be closer to the current target frequency. The digital phase locked loop is configured to control the digitally controlled oscillator to reduce any difference between the frequency of the digitally controlled oscillator and the current target frequency arising from any deviation of the model of the digitally controlled oscillator from the digitally controlled oscillator.

15 Claims, 8 Drawing Sheets

(56) References Cited

U.S. PATENT DOCUMENTS

| | | | |
|---|---|---|---|
| 2007/0195917 A1* | 8/2007 | Landmark | H03L 7/093 375/376 |
| 2008/0106340 A1 | 5/2008 | Lee et al. | |
| 2008/0197897 A1* | 8/2008 | Iwaida | H03L 7/085 327/157 |
| 2010/0026406 A1* | 2/2010 | Fujiwara | H03L 7/087 331/36 R |
| 2010/0141314 A1 | 6/2010 | Chen | |
| 2010/0183109 A1* | 7/2010 | Lin | H03L 7/081 375/376 |
| 2012/0056654 A1 | 3/2012 | Lee et al. | |
| 2013/0278303 A1 | 10/2013 | Chen et al. | |
| 2015/0077164 A1* | 3/2015 | Chen | H03L 7/103 327/157 |
| 2015/0222279 A1* | 8/2015 | Chen | H03L 7/0891 327/157 |

OTHER PUBLICATIONS

Andersson, F. et al. "Modeling and Characterization of All-Digital Phase-Locked Loop", Linkopings Universitet, Department of Science and Technology, Sweden, 93 pgs., retrieved from the internet at: http://www.diva-portal.org/smash/get/diva2:303870/fulltext02 (Feb. 17, 2010).

Harney, A. et al. "Fractional-N PLL-Based Frequency Sweep Generator for FMCW Radar", Analog Devices, 34 pgs., retrieved from the internet at: https://www.armms.org/media/uploads/1304696084.pdf (Apr. 10, 2010).

* cited by examiner

DIGITAL PHASE LOCKED LOOPS

CROSS-REFERENCE TO RELATED APPLICATIONS

This application claims the priority under 35 U.S.C. § 119 of European Patent application no. 16150342.0, filed on Jan. 6, 2016, the contents of which are incorporated by reference herein.

The present specification relates to digital phase locked loops, and in particular to all digital phase locked loop systems, and apparatus including such systems, and related methods of operation.

Phase locked loops are known generally and have a range of different applications. Generally speaking, a phase locked loop, PLL, provides a way of producing an oscillating output signal with a highly stable frequency which tracks a reference frequency of an input signal, by locking the output signal to the input signal based on the relationship between their respective phases. A common implementation of a phase locked loop includes a phase detector determines the difference in phase between the input reference frequency and a fed back signal. A signal indicating the difference in phase is passed through a filter, often a low pass filter, and used to control an oscillator, the output of which provides the output signal. A sample of the output signal is fed back via a control loop, sometimes including a divide by N element, to provide the fed back signal to the phase detector. The oscillator can be controlled to increase or decrease its frequency of oscillation based on the difference between the phase of the fed back signal and in input signal, so that the phase difference between the input signal and output signal is held constant.

The divide by N element can be used to set or vary the relationship between the input reference frequency and the frequency of the output signal.

Phase locked loops can be implemented as analog phase locked loops, digital phase locked loops (DPLL), which may include some digital elements, or all digital phase locked loops (ADPLL).

The response rate of a phase locked loop is generally determined by the bandwidth of the control loop which depends on a number of factors, including the properties of the filter.

In some applications, in which the frequency of the reference frequency does not change, or changes only slowly, the response rate of the phase locked loop may not be important. However, in other applications, in which the reference frequency does vary, the response rate of the phase locked loop may be relevant.

Hence, a digital phase locked loop which can rapidly track changes in frequency of its input reference signal may be beneficial in some applications.

According to a first aspect of the present disclosure, there is provided an all digital phase locked loop system for providing a variable frequency output signal which tracks a variable frequency input signal, comprising: a digital phase locked loop, including a digitally controlled oscillator having an output arranged to provide a variable frequency output signal; and a model of the digitally controller oscillator, wherein the model represents the behaviour of the digitally controlled oscillator as a function of frequency, the model having a model input arranged to receive a signal indicating a current target frequency of a variable frequency input signal, wherein the model of the digitally controlled oscillator is configured to output at least one control signal to control the frequency of the digitally controlled oscillator to be closer to the current target frequency and wherein the digital phase locked loop is configured to control the digitally controlled oscillator to reduce any difference between the frequency of the digitally controlled oscillator and the current target frequency arising from any deviation of the model of the digitally controlled oscillator from the digitally controlled oscillator for the current target frequency.

In one or more embodiments, the digital phase locked loop may include a filter and the at least one control signal may be arranged to modify an output signal of the filter to control the frequency of the digitally controlled oscillator.

In one or more embodiments, the at least one control signal may be supplied to the digitally controlled oscillator to control the frequency of the digitally controlled oscillator.

In one or more embodiments, the model of the digitally controlled oscillator may be configured to generate a plurality of control signals, each providing a different fineness of control of the frequency of the digitally controlled oscillator.

In one or more embodiments, the plurality of control signals may comprise a first control signal providing coarse control, a second control signal providing moderate control and a third control signal providing fine control.

In one or more embodiments, the phase locked loop may include a filter and the first, second and third control signals may be arranged to modify respective first, second and third output signals of the filter to control the frequency of the digitally controlled oscillator.

In one or more embodiments, the phase locked loop may include a filter and the first and second control signals may be supplied to the digitally controlled oscillator to control its frequency and the third control signal may be arranged to modify an output signal of the filter to control the frequency of the digitally controlled oscillator.

In one or more embodiments, the digitally controlled oscillator may include a plurality of variable capacitance elements and the, or each, control signal may be used to change the capacitance of the variable capacitance elements to change the frequency of the digitally controlled oscillator.

In one or more embodiments, the plurality of variable capacitance elements may be varactors and the model may implement a model of a digitally controlled oscillator including a plurality of varactors. The model may be a linear model.

In one or more embodiments, the plurality of variable capacitance elements may be are capacitor banks and the model may implement a model of a digitally controlled oscillator including a plurality of capacitor banks each having a different frequency resolution.

In one or more embodiments, the model may include at least one look up table.

In one or more embodiments, the model may be further configured to interpolate between a first value and a second value of the current target frequency.

In one or more embodiments, the phase locked loop may include a filter and the filter may be configured to output a pre-set value when a transition between a rising and a falling, or a falling and a rising, frequency ramp signal is detected.

In one or more embodiments, the phase locked loop may include a filter and the model may be configured to update values stored in the model based on one or more signals output from the filter. The model may be further configured to filter the one or more signals output from the filter. Values initially stored in the model may be derived from measurements of settings of the oscillator as a function of frequency during a start up phase, or measurements of settings of the oscillator as a function of frequency during a test or calibration phase, or average model values for the oscillator.

According to a second aspect of the present disclosure, there is provided a package comprising a lead frame and a semi-conductor integrated circuit, wherein the semi-conductor integrated circuit is configured to provide the all digital phase locked loop system of the first aspect.

According to a third aspect of the present disclosure, there is provided a continuous wave radar system including: a variable frequency oscillator arranged to drive a transmission antenna; and a modulation circuit arranged to supply a frequency modulation signal to modulate the frequency of the variable frequency oscillator, wherein the modulation circuit includes an all digital phase locked loop system according to the first aspect or a package according to the second aspect.

According to a fourth aspect of the present disclosure, there is provided a method for providing a variable frequency output signal which tracks a variable frequency input signal, comprising: supplying a signal indicating a current target frequency for the variable frequency input signal to a model of a digitally controlled oscillator; generating at least one control signal using the model of the digitally controlled oscillator, using the control signal to control the frequency of a digitally controlled oscillator forming part of a phase locked loop to be closer to the current target frequency; and using the phase locked loop to further control the frequency of the digitally controlled oscillator to reduce any differences between the frequency of the digitally controlled oscillator and the target frequency arising from any deviations of the model of the digitally controlled oscillator form the digitally controlled oscillator for the current target frequency.

Features of the first aspect may also be counterpart features for the fourth aspect.

Example embodiments of the invention will now be described in detail, by way of example only, and with reference to the accompanying drawings, in which.

Similar items in the different Figures share like reference signs unless indicated otherwise.

Example all digital phase locked loop systems will be described below within the context of use in a continuous wave (CW) radar system. However, it will be appreciated that the all digital phase locked loop (ADPLL) systems and methods of operation may be used in a wide range of different applications and are not limited in their application to CW radar systems. The ADPLLs described below may be useful in any application and in particular in applications in which it may be beneficial to be able to track a variable frequency reference signal, for example, ADPLLs are also used for tuners for various different radio systems (e.g., AM, FM, DAB, DAB+,DAM, etc.), in satellite radio systems, in televisions, in vehicle intelligent traffic systems (ITS), in Ethernet transceivers, in Bluetooth and Bluetooth Low Energy (LE) applications and many more. ADPLL systems are especially useful the smaller that the process nodes become and/or when high performance and/or robustness are desirable.

Figure 1:
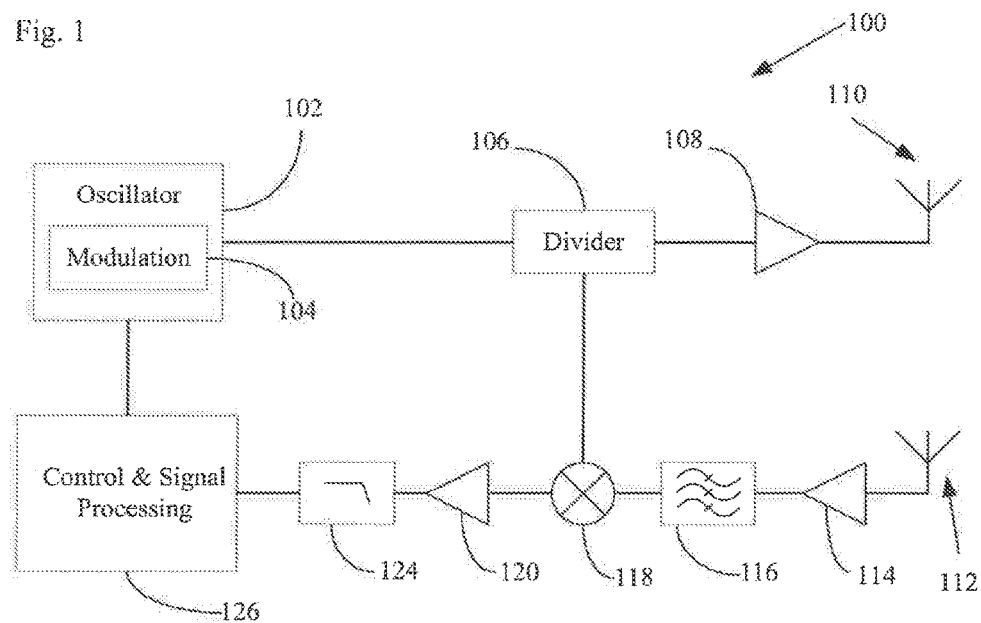
FIG. 1 shows a schematic block diagram of an example system in which an example all digital phase locked loop system may be used.

With reference to FIG. 1, there is shown a schematic block diagram of a CW radar system 100. The structure and operation of similar CW radar systems, absent the use of the ADPPL system described herein, is generally known to a person of ordinary skill in the art and so will not be described in detail. The CW radar system 100 includes a local oscillator 102 which includes a modulation circuit or device 104 operable to modulate the frequency of the local oscillator (LO) signal which is supplied via a power splitter 106 to a power amplifier 108 to supply a high power RF signal to transmission antenna 110. The power splitter supplies a small portion of the LO signal to a receiver leg of the system 100. The transmission antenna transmits an electromagnetic chirp signal at a transmission repetition frequency, which may be in the range of, for example, of order 1 kHz to 100 MHz. A receiver antenna 112 is arranged to receive any portion of the chirp signal reflected back from an object and transduce the EM radiation into an electrical signal. The electrical signal is passed to a low noise amplifier 114 whose output is filtered to remove unwanted components and the filtered output is mixed by a mixer 118 with the portion of the original LO signal which generates two signals: one at a combined frequency and another at a difference frequency (the intermediate frequency signal, IF). The output of the mixer 118 is amplified by amplifier and low pass filtered by low pass filter 122 and the IF signal is passed to a main control and signal processing circuit or device 124.

The distance between the transmitter and object results in a delay between the transmitted chirp signal and the received, reflected chirp signal. This translates into a frequency difference, which is the IF frequency, and which is a measure of the distance between the radar system and object. The control and signal processing device 124 processes the IF signal and determines the distance to, or range, of the object that reflected the signal. The control and signal processing device 124 may also issue control signals to the oscillator 102 and/or modulation circuit 104, to periodically modulate the frequency of the EM signal transmitted by the antenna 110. The variable frequency signal may be referred to as a chirp signal, but the system is not limited specifically to chirp signals and any modulation scheme which varies the frequency of the signal may be used.

Figure 2:
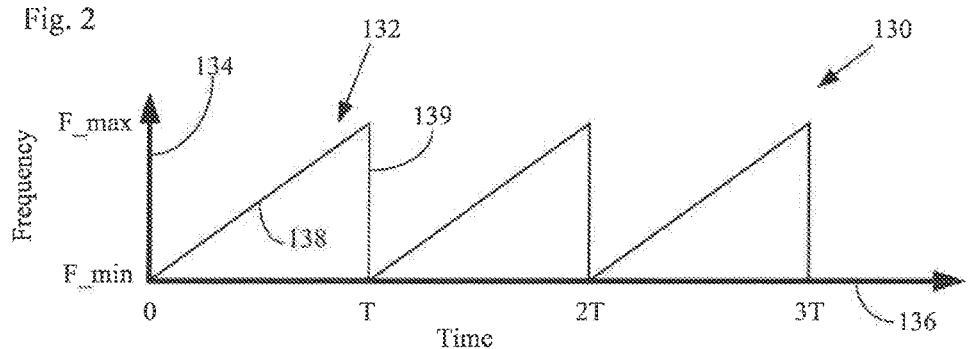
FIG. 2 shows a graphical representation of a first example signal that the all digital phase locked loop system may be used to generate.

For example, FIG. 2 shows a graphical representation 130 of a first periodic, frequency modulated signal 132 having a linear frequency ramp. FIG. 2 shows a plot of frequency 134 against time 136 and illustrates a slower linear ramp 138 from a minimum frequency value F_min, e.g. 70 GHz, to a maximum frequency value F_max, e.g. 80 GHz, and then a rapid return or fly back to F_min over a shorter time, e.g., 1 µs. The duration of the slower linear ramp 138 may be in the range of, for example, 15 µs to 1 ms, corresponding to repetition time periods T of approximately 150 µs to 1 ms and hence repetition frequencies in the range of approximately 6.7 MHz to 1 kHz. The repetition frequency of the frequency modulation may generally be referred to herein as the 'chirp frequency' for sake of brevity, but is not intended to limit the frequency modulation only to a specific chirp frequency modulation.

Figure 3:
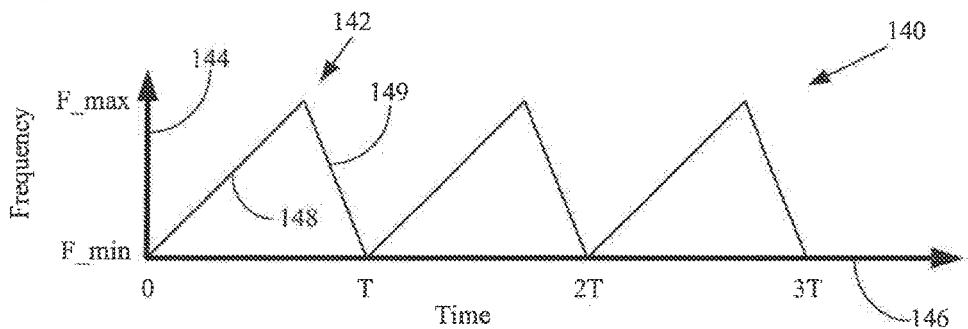
FIG. 3 shows a graphical representation of a second example signal that the all digital phase locked loop system may be used to generate.

By way of further example, FIG. 3 shows a graphical representation 140 of a second periodic, frequency modulated signal 142 having a linear frequency ramp. FIG. 3 shows a plot of frequency 144 against time 146 and illustrates a faster linear ramp 148 (compared to FIG. 2) from a minimum frequency value F_min, e.g. 70 GHz, to a maximum frequency value F_max, e.g. 80 GHz, over a time, e.g., of 100 µs and then a less rapid return 149 (compared to FIG. 2) back to F_min over a time, e.g., 50 µs, corresponding to a repetition time period, T, of, e.g., 150 µs, and hence repetition frequency of about 6.7 MHz.

It will be appreciated that other variable frequency waveforms can also be used, such as equal rising and falling rates, and also non-linear rates, such as parabolic rising and/or falling rates.

Hence, modulation circuit 104 supplies a modulation signal to the local oscillator LO to modulate its frequency on a periodic basis. As illustrated in FIGS. 2 and 3, the period of the modulation signal may be very short, e.g. around 100 µs and with the desire to be shorter, and therefore the modulation circuit may have fast reaction times in order to be able to generate the desired modulation. Also, the accuracy of distance measurement may improve with the linearity of the frequency modulation and therefore reliable linear operation of the modulation circuit may be beneficial.

Figure 4:
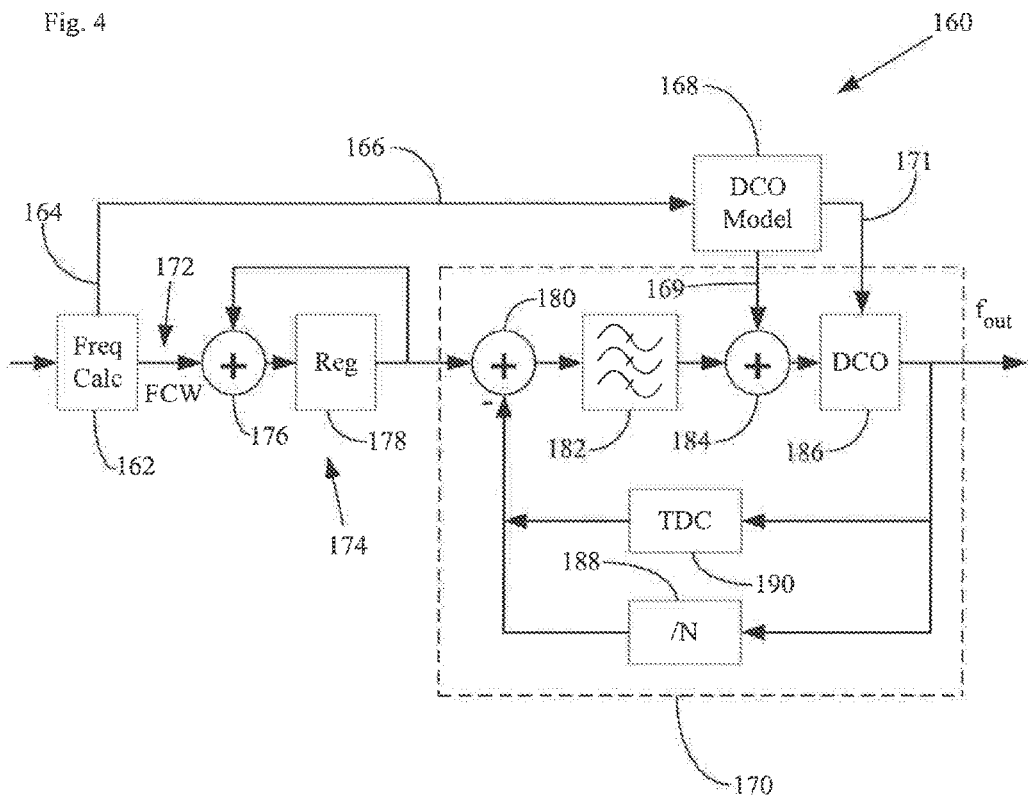
FIG. 4 shows schematic block diagram of an example all digital phase locked loop system which may be used in the system of FIG. 1 or to generate the signals illustrated in FIGS. 2 and 3.

FIG. 4 shows a schematic block diagram of an all digital phase locked loop (ADPLL) system 160 which may be used in the modulation circuit 104 of the system 100 of FIG. 1. ADPLL 160 is general purpose and may be used to implement any type of frequency modulation scheme. The ADPLL system includes an input 162 for receiving a control signal defining the frequency modulation scheme. A frequency calculation circuit 162 receives the control signal and calculates a current target value for the frequency, under the frequency modulation scheme, at the current point in time. A first output 164 of the frequency calculation circuit 162 outputs a signal indicative of the current target frequency value on a feed forward path 166 to a circuit or device implementing a model 168 of a digitally controlled oscillator of the all digital phase locked loop 170 itself, as will be described in greater detail below.

A second output 172 of the frequency calculation circuit 162 outputs a signal indicative of a current value of a frequency control word (FCW) to a phase accumulator circuit 174 which includes a summer 176 and a register 178. The register 178 outputs a value of the current total phase store in the register and its output is fed back to the summer 176. The summer adds the FCW to the current value of the total phase to increment the current value of the total phase on each clock cycle of the system. Hence, the current total value of the phase output by the register 178 as the input to the all digital phase locked loop (ADPLL) 170 can be increased and decreased at different rates by changing the amount and the sign of the FCW and hence provides a digital input to the ADPLL 170 corresponding to the desired frequency modulation scheme.

The ADPLL 170 includes an input having a phase difference detector which receives the frequency modulation scheme control signal as its input reference frequency signal at a first input and the negative value of a feedback signal at a second input. A signal indicative of the phase difference between the reference frequency signal and feedback signal is supplied to a filter 182, typically a low pass filter, and the output of the filter 182 is used to control the frequency of a digitally controlled oscillator 186. As illustrated by second summer 184 the signal output by the filter may also be combined with a first control signal output by the model 168 of the digitally controlled oscillator 186 to modify the frequency control signal supplied to the digitally controlled oscillator. The model 168 of the digitally controlled oscillator may additionally, or alternatively, output a second control signal 171 which may be used directly to modify the frequency of the digitally controlled oscillator 186 as described in greater detail below. The ADPLL 170 also includes a feedback path which may include a feedback divider 188 and a time-to-digital (TDC) converter 190 which feedback a measure of the phase of the output frequency signal, f_out, output from the ADPLL back to the phase difference detector 180. The operation of a digital phase lock loop similar to ADPLL 170, but omitting the second summer 184 and control of the digitally controlled oscillator 186 by signals from the model 168, is known generally in the art and will not be described in detail herein.

In the ADPLL system 160 of FIG. 4, the model of the oscillator 168 is used to calculate settings for the physical oscillator 186 so that the ADPLL 170 is used only to remove or reduce any differences between the model of the oscillator 168 and implemented oscillator circuit 186. This may permit a frequency ramp of any shape and rate to be generated and that is nearly independent from the loop parameters of the ADPLL 170.

Figure 5:
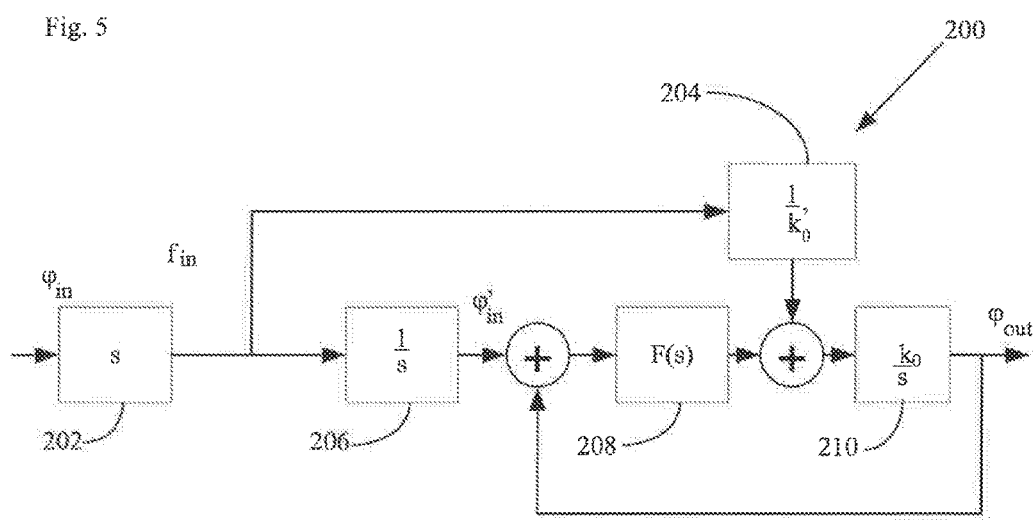
FIG. 5 shows a schematic block diagram representing the system of FIG. 4 in the frequency domain.

FIG. 5 shows a schematic block diagram 200 of the ADPLL system 160 of FIG. 4 transformed into the frequency domain. Block 202 represents the source of the variable frequency input signal having a frequency $f_{in}$ and a phase $\varphi_{in}$, block 204 represents the model of the digitally controlled oscillator, block 206 represents the phase accumulator 174, which supplies a signal with phase $\varphi_{in}'$ as an input to the digital phase locked loop 170, block 208 represents the filter 182 and block 210 represents the digitally controlled oscillator 186 which outputs the output signal with a phase $\varphi_{out}$.

The phase transfer function h(s) of a phase locked loop with a first order loop filter and using an oscillator model can be calculated to a standard form $$h(s) = \frac{\frac{k_o}{k_o'} \cdot s^2 + 2 \cdot \xi \cdot \omega_n \cdot s + \omega_n^2}{s^2 + 2 \cdot \xi \cdot \omega_n \cdot s + \omega_n^2} \quad (1)$$

Where s is a complex number of the form $s=\sigma-j\omega$, $k_o$ is the oscillator gain or oscillator steepness, $k_o'$ is the oscillator model gain or steepness, $\xi$ is a damping factor, and $\omega_a$ is the natural angular frequency. For $k_o' \to \infty$, equation (1) reduces to the characteristic of a system without an oscillator model, since the output of the model is always zero $$h(s) = \frac{2 \cdot \xi \cdot \omega_n \cdot s + \omega_n^2}{s^2 + 2 \cdot \xi \cdot \omega_n \cdot s + \omega_n^2} \quad (2)$$

From this the possible tracking speed of the phase locked loop in the absence of the oscillator model can be calculated, by calculating the final value of the phase error for a frequency ramp. The phase error transfer function is given by:

$$h_e(s) = 1 - h(s) \quad (3)$$

In the Laplace phase domain, a frequency ramp can be described by:

$$\varphi_{in,ramp} = \dot{\omega} \cdot \frac{1}{s^3} \quad (4)$$

The condition to determine the maximum frequency ramp rate is that the loop is still kept in lock which means that the phase error does not exceed the detection range of the phase detector: $\pm\varphi_{max}$. Using the final value theorem of the Laplace transform, this leads to:

$$\lim_{s \to 0} |s \cdot \varphi_{in,ramp} \cdot h_e(s)| < \Delta\varphi_{max} \quad (5)$$

Evaluating this for, for example, a positive frequency ramp $\dot{\omega} > 0$ and a $2^{nd}$ order system, gives:

$$\dot{\omega} < \varphi_{max} \cdot \frac{\omega_n^2}{1 - \frac{k_o}{k_o'}} \quad (6)$$

which reduces, in the limit $$\frac{k_o}{k_o'} \to 0,$$

to:

$$\dot{\omega} < \Delta\varphi_{max} \cdot \omega_n^2 \quad (7)$$

which is the maximum possible tracking speed for the PLL without the oscillator model.

For a perfect model of the oscillator $$\frac{k_o}{k_o'} \to 1,$$

and so $\dot{\omega} \to \infty$, which mean that any tracking speed could be supported and the feedback control loop would not be needed.

In general the ratio between the model of the oscillator and the real oscillator will deviate from 1. Assuming that $$\frac{k_o}{k_o'} = 1 + a,$$

then a represents the deviation of real oscillator from the model of the oscillator. In this case, equation (6) becomes:

$$\dot{\omega} < \Delta\varphi_{max} \cdot \frac{\omega_n^2}{a} \quad (8)$$

Hence, the deviation ratio between real oscillator and the mode of the oscillator is the factor that increases the tracking speed of the ADPLL system 160. For example a deviation of 1% will increase the tracking speed limit by a factor of 100 times compared to a PLL without the oscillator model.

Also the bandwidth gets considerably larger from $\varphi_{in}$ in FIG. 5 to $\varphi_{out}$. Generally speaking, a transfer function may have poles and zeros. A 'pole' refers to a frequency in the transfer function at which the denominator goes to zero, whereas a 'zero' refers to a frequency at which the numerator goes to zero. A pole corresponds to a low pass characteristic, whereas a zero corresponds to a high pass characteristic. Hence, a zero can cancel the roll off of a low pass filter and vice versa. The positions of zeros and poles in the complex plane define the characteristic of a filter. As can be seen above, equation (1) has a zero more than equation (2), owing to the extra term in its denominator. Hence, the additional term in equation (1) compared to equation (2) introduces an additional zero which cancels the roll off and limits the attenuation from a certain frequency onwards.

The phase noise performance of the system can be assessed by considering $\varphi'_{in}$ in FIG. 5 and under the assumption that there are no noise contributions from the oscillator model. This means that the system performance can be optimized for a system without a model with respect to phase noise and that the tracking speed can be accelerated by a factor that only depends on the accuracy of the model.

The same analysis may also be applied for any other system order, negative frequency slope and/or asymmetrical phase detectors as well. The underlying principle does not change.

Figure 6:
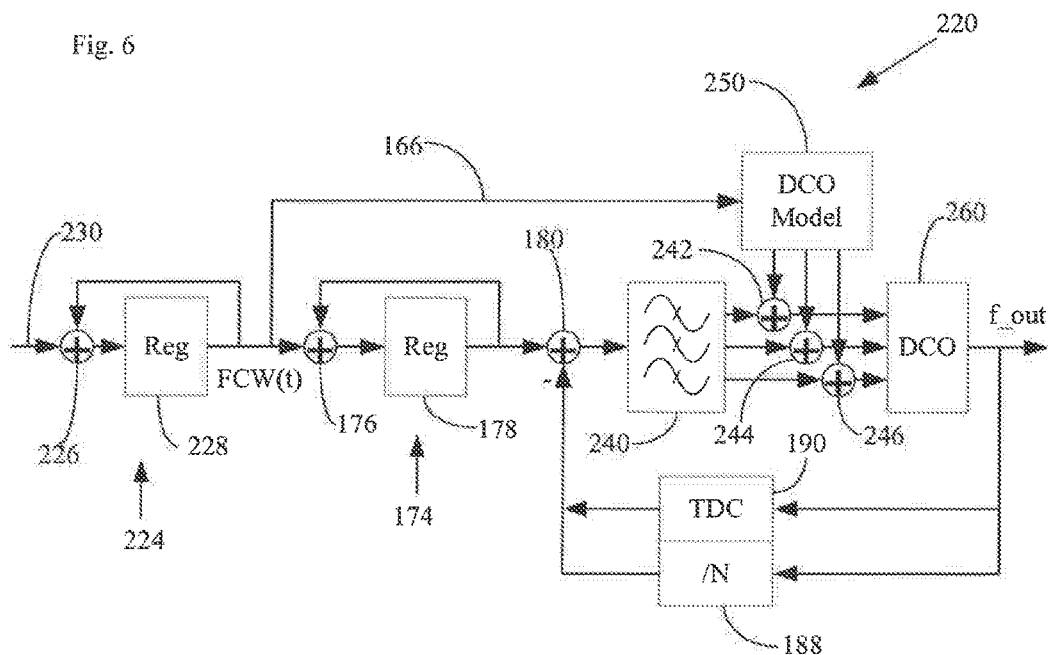
FIG. 6 shows a schematic block diagram of a further all digital phase locked loop system corresponding to FIG. 4 using a first oscillator model.

FIG. 4 shows an embodiment of the ADPLL system 160 which may be applied to any type of frequency ramp and shape of ramp. FIG. 6 shows a further ADPLL system 220, similar to that shown in FIG. 4, but in which the frequency calculation circuit 162 is implemented by an accumulator circuit 224 comprising a summer 226 and a register 228 whose output is fed back to the summer. The summer receives an input signal 230 defining a current value of a frequency ramp steepness and the accumulator outputs a current value of a frequency control word FCW(t) which is a function of time. The phase accumulator 174 and structure of the ADPLL is generally the same as that shown in FIG. 4. However, loop filter 240 includes three outputs providing three filter output signals which are each supplied to a respective signal combiner 242, 244, 246 where they are each combined with a respective one of three control signals output by the digitally controlled oscillator model 250. The control signals from the oscillator model 250 are combined with the filter output signals to provide coarse, medium and fine control of the frequency of the digitally controlled oscillator 260. The current FCW is fed forward on line 166 to the DCO model 250 which determines the signals to apply to the DCO 260 for the current frequency set by the current FCW word. Any mismatch between the frequency of the DCO as set by the model and the current target value of the frequency is decreased by the phase locked loop. In this way the ADPLL system 220 may follow any shape for the frequency ramp.

Figure 7:
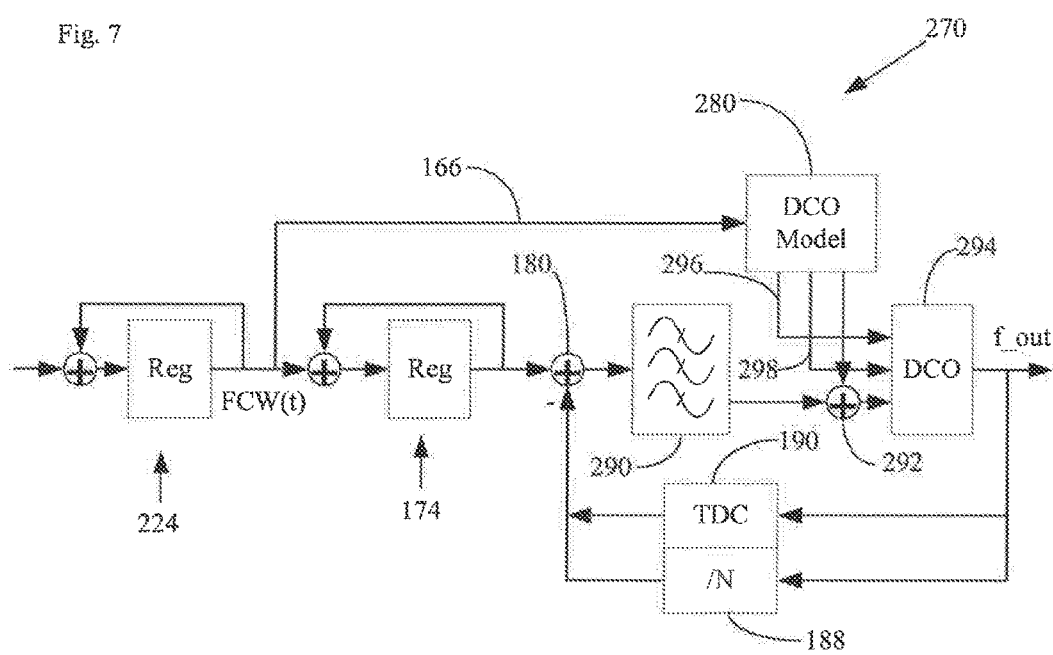
FIG. 7 shows a schematic block diagram of a further all digital phase locked loop system corresponding to FIG. 4 using a second oscillator model.

FIG. 7 shows a further ADPLL system 270 similar to that shown in FIG. 6. In the ADPLL system 270, the model 280 of the oscillator 294 is more accurate than in the system of FIG. 6. This permits the model 280 of the digitally controlled oscillator to directly control the digitally controlled oscillator 294 as illustrated by control lines 296, 298 which may respectively provide coarse and medium frequency control signals. A fine frequency control signal may then be output by DCO model 280 and combined at signal combiner 292 with a single output of the loop filter 290 to provide fine control of the DCO 294.

The performance of the systems 160, 220 and 270 is determined by the accuracy of the oscillator model and the tracking range of the ADPLL 170. The accuracy of the model should be within the tracking range of the ADPLL. In that case the ADPLL can follow any frequency ramp or shape. If the model is sufficiently accurate, then one or more of the settling phase for coarse and medium frequency adjustment, as used in system 220 of FIG. 6, may not be needed. In that case the coarse and medium frequency settings of the oscillator 294 may be derived completely from the model as in the system 270 illustrated in FIG. 7. In this way the loop filter 290 can be simpler and the phase locked loop may be faster since there will be no settling phase for the coarse and medium control signal s from the loop filter.

The systems 160, 220, 270 are highly linear and without ripple in the frequency for well selected loop parameters. The linearity depends also on the relation between the update frequency of the loop filter and the loop dynamics. Any drawbacks, for example owing to limited time resolution of the ramp and fast loop settings giving rise to step changes in the DCO frequency, may be reduced by appropriate settings for the loop dynamics and/or by the DCO model 168, 250, 280 interpolating frequency steps with a higher frequency resolution and in accordance with the loop dynamics.

Figure 8:
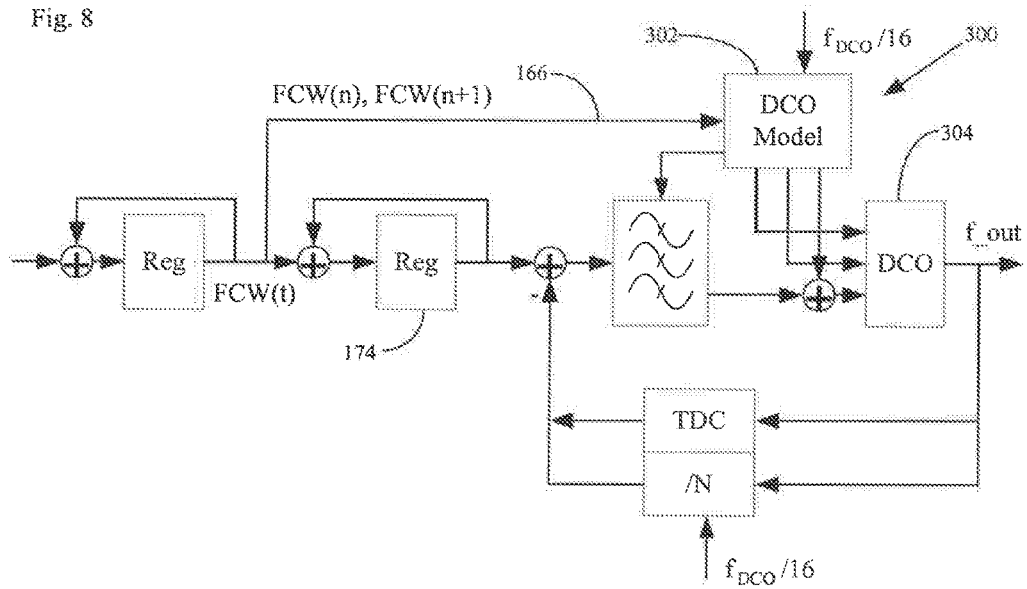
FIG. 8 shows a schematic block diagram of a further all digital phase locked loop system corresponding to FIG. 4 using a third oscillator model.

FIG. 8 shows a schematic block diagram of an ADPLL system 300 similar to the ADPLL system 270 of FIG. 7 and in which the DCO model 302 is configured to provide frequency interpolation. For example, if the registers of the phase accumulator 174 are being clocked at 60 MHz, and the DCO 304 is oscillating around the 6 GHz frequency, then on any divided ratio of the oscillator, e.g. $f_{DCO}/16$, the FCW steps may be interpolated. The ramp generator portion of the system that provides the frequency ramp to the DCO 302 provides the last used (current) FCW(n), and also the next FCW (n+1) to the DCO model 302. The DCO model 302 is configured to calculate, for a current moment in time, an interpolated value for the FCW, which is used to as the current target value of the DCO frequency, so as to provide a smooth variation between the frequency values corresponding to FCW(n) and FCW(n+1). This can be done by counting the number of DCO clock cycles between two clock cycles of the reference frequency, in this example $f_{DCO}/16$, and interpolating the FCW value between FCW(n) and FCW (n+1), when relating the actual number of clock cycles, e.g. from the last reference event, to the total number of clock cycles. For simpler modulation schemes, e.g. linear modulation of the frequency over time, then a linear interpolation is sufficient. For more complex modulation schemes, then non-linear interpolation may be used. Also the changing DCO frequency may be taken into account by integration of the frequency over time for the total number of clock cycles between two reference clock cycles as well as for the current moment in time.

The resolution of the FCW determines the resolution of the ramp and therefore the accuracy of the system.

Also, in some embodiments, the DCO model may not support the whole of the chirp signal. For example, the slow ramp portion 148 of the chirp signal illustrated by FIG. 3 may be handled by the normal dynamics of the phase locked loop 170 alone. The model may then be used only to support the more rapid fly back part of the chirp 149 (from F_max back to F_min). Under ideal conditions the fly back time may be close to zero, as illustrated in FIG. 2. At the transition between rising and falling slope there can still be a disturbance. To avoid this an integrator, or integrators, in the loop filter may also be pre-set at the transition with values derived from the oscillator model.

Figure 9:
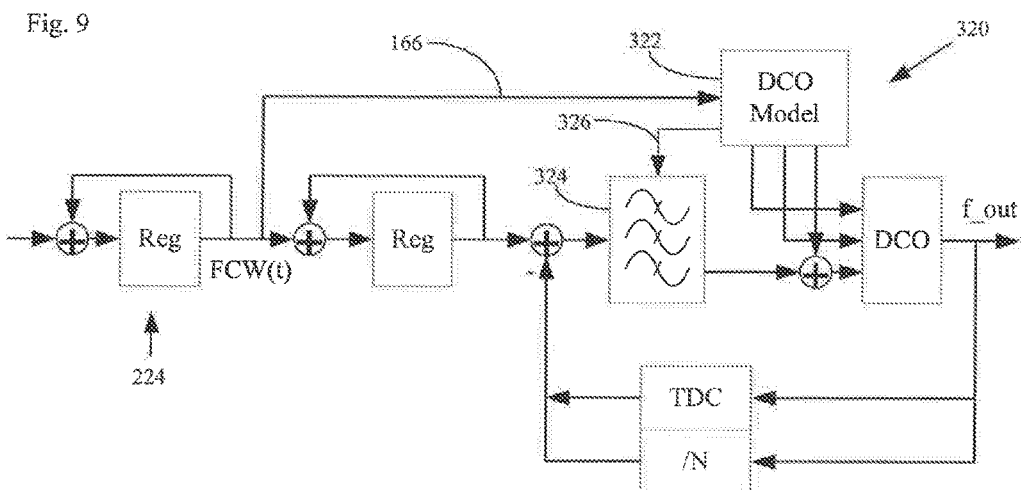
FIG. 9 shows a schematic block diagram of a further all digital phase locked loop system corresponding to FIG. 4 using a fourth oscillator model.

FIG. 9 shows a schematic block diagram of an ADPLL system 320 similar to the ADPLL system 270 of FIG. 7 and in which the DCO model 322 and loop filter 324 are configured to reduce any disturbance at a rising/falling slope transition. As noted above, the DCO model 322 is connected 326 to the loop filter 324 to provide one or more values derived from the oscillator model 322 which may be used to preset one or more integrators of the loop filter.

Figure 10:
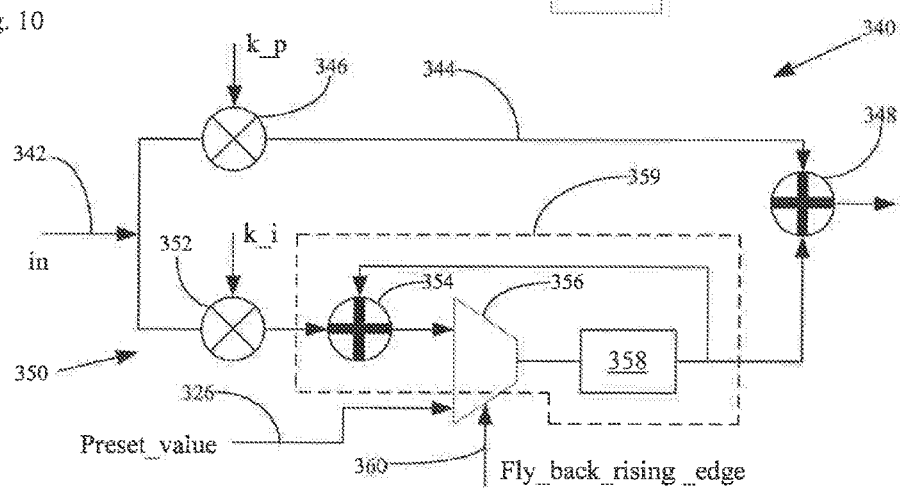
FIG. 10 shows a schematic block diagram of a loop filter part of the system illustrated in FIG. 9.

FIG. 10 shows a schematic block diagram 340 of the loop filter 324. The loop filter 340 has an input 342 and includes a proportional signal path 344 and an integral signal path 350. The proportional signal path 344 includes a signal multiplier 346 which can multiply the input signal with a proportional coefficient or factor, k_p, to implement a proportional filtering operation. The proportional signal is then combined with any integral signal from the integral signal path at an output summing device 348. The integral signal path 350 includes a signal multiplier 352 which can multiply the input signal with an integral coefficient or factor, k_i, a signal combiner 354, a multiplexer 356, and a register 358, whose output can be fed back to the signal combiner 354 and also provided to the output summing device 346. Components 354, 356, 358 and the feedback path act together as an integrator, as indicated by dashed box 359. The multiplexer 356 has an output of the DCO model on connection 326 connected to a second input and is operable by a timing signal 360 corresponding to the rising edge of the fly back portion of the ramp signal to signify the transition between a rising and falling frequency ramp (or vice versa). The DCO model 322 is configured to support the transition between a rising and falling frequency ramp from the frequency data being supplied from the ramp generator portion of the system on line 166.

During the slower ramp portion of the frequency modulation signal, the loop filter operates as normal to provide proportional and integral filtering of the input signal from the phase difference detector. When the transition between the slower rising ramp and rapid fly back falling ramp is detected by the DCO model 322 and signaled by the fly back rising edge signal 360 being asserted by the DCO model, the multiplexer 356 is switched and instead a preset value 362 for the integral filtering portion of the loop filter is supplied by the DCO model 322 for the integral portion of the loop filter. This permits the fast fly back portion of the frequency modulation signal to be handled and without dynamic disturbances to the ADPLL.

Figure 11:
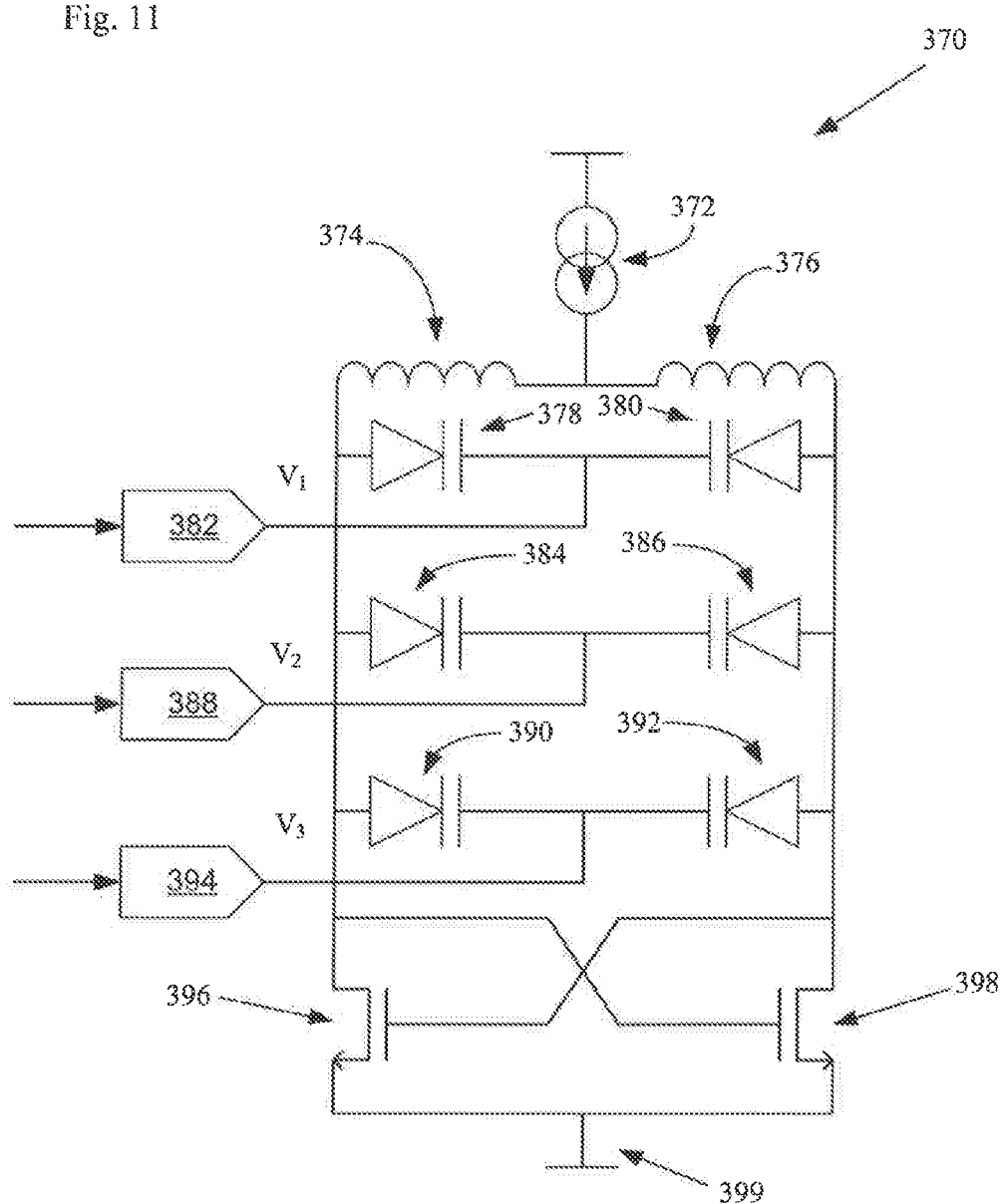
FIG. 11 shows a schematic block diagram of a first digitally controlled oscillator that may be used in the all digital phase locked loop system.

FIG. 11 shows a schematic block diagram of a first example digitally controlled oscillator 370 which may be used in the ADPLL system. The digitally controlled oscillator 370 may be particularly suitable for the ADPLL system 220 illustrated in FIG. 6. Digitally controlled oscillator 370 is implemented using varactors diodes which provide voltage controlled capacitances. Digitally controlled oscillator 370 includes a current source 372 connected between a pair of inductors 374, 376. A first mirrored pair of varactors 378, 380 are connected in parallel with the pair of inductors 374, 376 with their cathodes connected to the output of a first digital to analogue converter 382. A second mirrored pair of varactors 384, 386 are also connected in parallel with their cathodes connected to the output of a second digital to analogue converter 388. A third mirrored pair of varactors 390, 392 are also connected in parallel with their cathodes connected to the output of a third digital to analogue converter 394. A pair of transistors 396, 398 are also provided with their respective collectors connected to the inductors, their emitters connected to ground 399 and their respective bases connected to the other's collector. The pairs of varactors, inductors and transistors provide an adjustable frequency oscillator whose frequency of oscillation can be changed by varying the capacitance of the resonant parts of the circuit.

A first digital control signal from signal combiner 242 may be supplied to first DAC 382 to be converted to an analog signal which is supplied to bias the cathodes of the first pair of varactors 378, 380. The first pair of varactors 378, 380 may provide coarse adjustment of the oscillator frequency by permitting large changes in their capacitance and hence large variations of the frequency of oscillation. This first pair of varactors can provide control of the frequency over what is sometimes referred to as a process/voltage/temperature (PVT) range of values. A second digital control signal from signal combiner 244 may be supplied to second DAC 388 to be converted to an analog signal which is supplied to bias the cathodes of the second pair of varactors 384, 386. The second pair of varactors 384, 386 may provide medium or moderate adjustment of the oscillator frequency by permitting medium or moderate changes in their capacitance and hence medium or moderate variations of the frequency of oscillation. This second pair of varactors can provide control of the frequency over what is sometimes referred to as an acquisition (ACQ) range of values. A third digital control signal from signal combiner 246 may be supplied to third DAC 394 to be converted to an analog signal which is supplied to bias the cathodes of the third pair of varactors 390, 392. The third pair of varactors 390, 392 may provide fine adjustment of the oscillator frequency by permitting small changes in their capacitance and hence fine variations of the frequency of oscillation. This third pair of varactors can provide control of the frequency over what is sometimes referred to as a tracking (TR) range of values.

The model of the digitally controlled oscillator determines the coarse (PVT), medium (ACQ) and fine (TR) settings, for a specific frequency, for the DCO and outputs appropriate digital control signals. The settings for the coarse, medium and fine frequency control may not be unique. Firstly, the coarse value is set as and is a function of frequency alone, i.e. set PVT(f). Then, the medium value may be set and is a function of the coarse value and frequency, i.e. ACQ(PVT,f). Finally, the fine value may be set and is a function of the coarse and medium values as well as frequency, i.e. TR(PVT,ACQ,f). The DCO model takes into consideration the dependencies between the DCO frequency and the PVT, ACQ and TR settings. Owing to the $1/(LC)^{1/2}$ behavior of the resonant frequency, this is not a linear dependency, as discussed below. The DCO model can implemented as a generalized and averaged model for all process, voltage and temperature settings or with parameters stored from individual measurements, as also described below.

One way of providing a model of the digitally controlled oscillator is to use a look up table. There are several options to populate the look up table.

A first approach is to populate the look up table using measurements obtained during a calibration phase either right after the ADPLL system has started up or repetitively during operation. Doing the calibration repetitively during operation has the advantage of being able to follow any temperature variations as well. If the calibration is done right after startup, then interpolation may be used to compensate for any temperature changes on a chip, based on temperature measurements during operation, for example using a temperature sensors on the chip.

A second approach is to store real values from a previous ramp generation cycle in the look up table and take these values as a best guess for the next ramp generation cycle. An advantage of this approach is that it is very linear and also follows temperature trends directly without requiring ancillary circuitry, such as temperature sensors. Temporal noise in the values may be removed or reduced by updating the values stored in the look up table via a low pass filter. The same low pass filter may be used for every look up table entry if the old value is stored in an integrator of the low pass filter and the new value is applied to the input.

Figure 12:
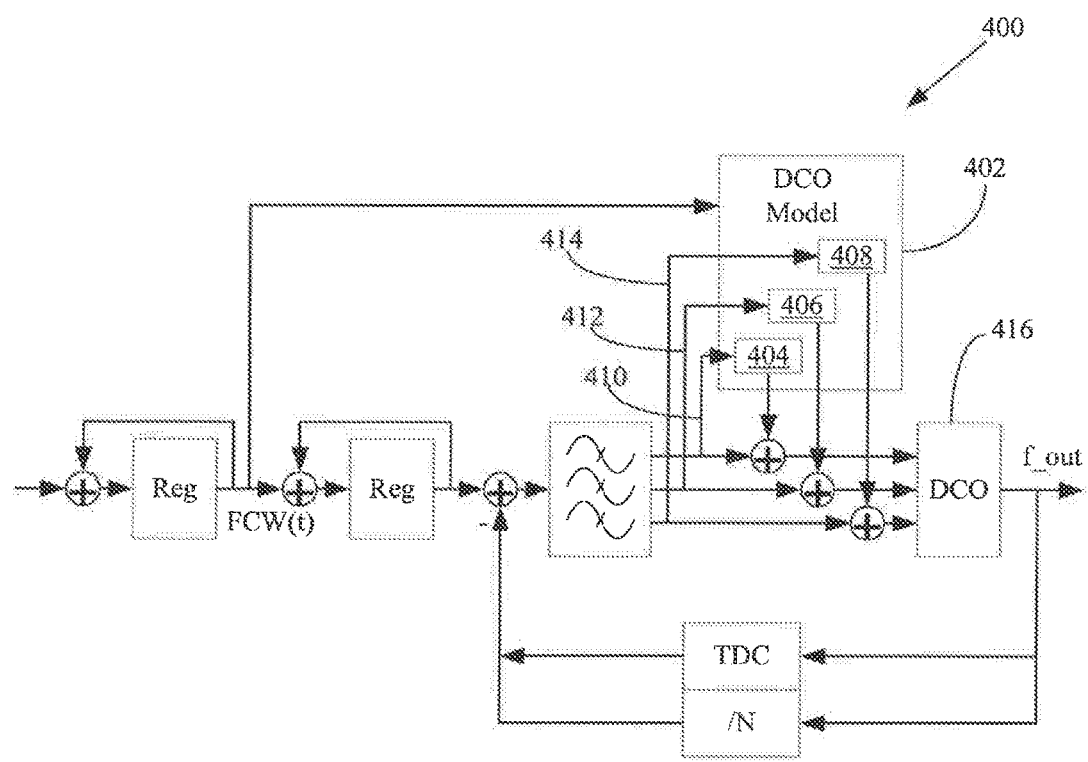
FIG. 12 shows a schematic block diagram of a further all digital phase locked loop system corresponding to FIG. 4 using a fifth oscillator model.

FIG. 12 shows a schematic block diagram of a further ADPLL system 400 similar to that shown in FIG. 6 and including a digitally controlled oscillator model 402 which may be used to implement this second approach. The digitally controlled oscillator model 402 includes three filter and memory circuits 404, 406, 408. The first filter and memory circuit 404 is for coarse or PVT values and has an input arranged to receive the coarse or PVT output from the low pass filter on line 410 and has an output arranged to supply the coarse or PVT control signal from the model 402 to control the DCO. The second filter and memory circuit 406 is for moderate or ACQ values and has an input arranged to receive the moderate or ACQ output from the low pass filter on line 412 and has an output arranged to supply the moderate or ACQ control signal from the model 402 to control the DCO. The third filter and memory circuit 408 is for fine or TR values and has an input arranged to receive the fine or TR output from the low pass filter on line 414 and has an output arranged to supply the fine or TR control signal from the model 402 to control the DCO.

Figure 13:
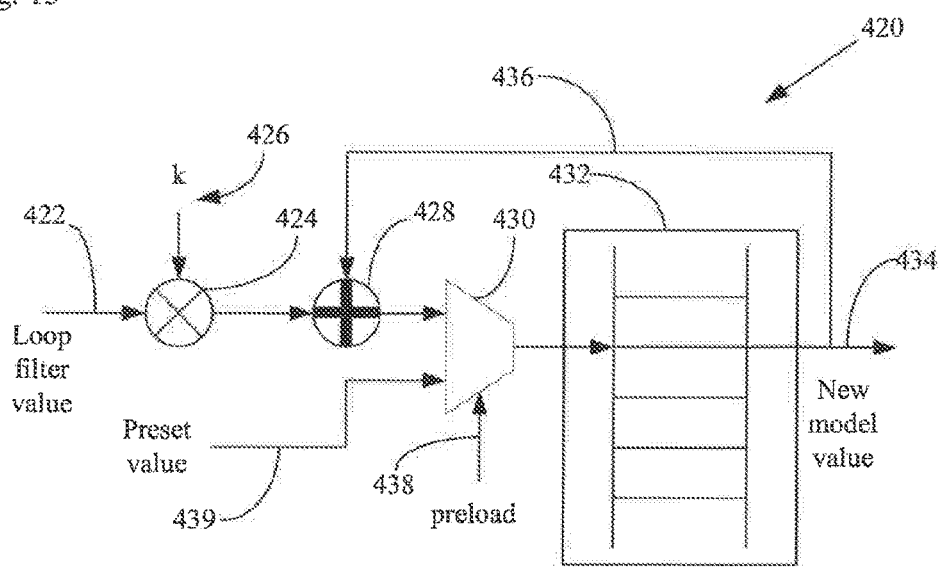
FIG. 13 shows a schematic block diagram of a settings value filtering and updating part of the digitally controlled oscillator model which may be used in the all digital phase locked loop system.

FIG. 13 shows a schematic block diagram 420 illustrating the filter and memory circuits 404, 406, 408. Each includes an input 422 arranged to receive a respective output of the low pass filter. The signal output by the low pass filter is indicative of the difference between the DCO model setting and the actual DCO setting at the current point in time. The input 422 is connected to a signal multiplier 424 which also receives a filter factor k 426 and implements a low pass filter which provides low pass filtering of the incoming signal so that any noise in the ADPLL system 400 is attenuated. In order to help reduce any instability of the system 400, the bandwidth of the low pass filter is preferably considerably lower than the bandwidth of the loop 170. The output of the low pass filter is supplied to a first input of a signal combiner 428 the output of which is connected to a first input of a multiplexer 430. The output of the multiplexer 430 is supplied to a memory or storage device 432 which stores the look up table values. The memory or storage device 432 has an output 434 arranged to supply a corresponding control signal from the look up table in memory 432 to control the digitally controlled oscillator 416, as illustrated in FIG. 12. The output of the memory 432 is also supplied by a feedback path 436 to a second input of the signal combiner 428. The multiplexer 430 receives a preload control signal 438 which operates the multiplexer to switch its inputs to supply a preset value or values on a second input 439 to the memory or storage device 432.

The circuits 404, 406, 308 provide initial values to the DCO model 402 which are refined every time the values are used to control the DCO 416. In this way, the DCO model becomes more accurate over time. It will be appreciated that in other embodiments fewer filtering and value updating circuits 404, 406, 408 may be used.

The circuits 404, 406, 408 in the DCO model and the DCO model can be configured to permit a number of different methods of operation of the ADPLL system 400 to be realised.

The DCO oscillator frequency can be measured as a function of different values of the settings during start up and the setting values can be stored in the memory. The results can also be stored in a different memory, e.g. in a nonvolatile memory, so that they are available as a starting value for the next startup of the ADPLL, system in order to reduce start up time. During the startup measuring phase, the memory 432 is directly loaded with the measurement value by setting the preload signal 438 after each measurement and the measured setting values are provided on the preset value input 439 as the preset value for each memory cell. If the measurement results for a previous startup measurement have been stored in a separate nonvolatile memory, then the preload signal 438 is set immediately before system start up to load the preset values from the nonvolatile memory on input 439 into the memory 432. This latter approach helps reduce the startup time of the ADPLL system 400.

In a second method, the oscillator frequency is measured as a function of DCO settings during a test phase of the circuit and the corresponding look up table or test or calibration data is stored in a nonvolatile memory in the DCO model 402. At start up, the preload signal 438 is set and the test or calibration data are loaded into memory 432 as the preset value inputs 439. While this approach may reduce start up time, it may be less accurate as any effect of the actual temperature of the DCO 426 is not taken into consideration as in the preceding approach.

In a third method, look up table date for an average model of the DCO 416 is preloaded into the memory 432 as the preset input values on input 439 after the system is reset. In this case, the preload signal 438 is derived from a power-on-reset or a system-reset signal.

Irrespective of how the initial values are derived, in all cases the DCO model 402 will be very accurate for each sample after some time of use of the oscillator 416 when the learning phase is completed by updating the values stored in memory 432 by filtering the incoming values and updating the model values stored in memory device. The loop filter value 422 will get smaller after each iteration as the values stored in the memory 432 become more accurate with each iteration.

Which of the methods for setting initial values may depends on system and user requirements. The first approach provides better starting values but extends the startup time most. If stored values are used, then the startup time can be reduced. The third approach may need the longest time to settle the DCO model.

The frequency of the digital controlled oscillator 370 as a function of the three control signals can be modelled in the following way. Varactors have a smooth capacitance as a function of biasing voltage, C(V), characteristic. In the center this characteristic may be considered to be linear. A simple function of the form:

$$C(V) = C_o + \frac{\partial C}{\partial V} V = C_o + \frac{\partial C}{\partial V} \Delta V_{DAC} \cdot DAC_{in} \tag{9}$$

may be used to evaluate the capacitance as a function of the control voltages output by the DACs 382, 388, 394, where $DAC_{in}$ is the equivalent coarse (PVT), medium (ACQ) or fine (TR) setting for each variable capacitance bank. By design measures the linearity range of the varactors may be extended. If the varactors are to be operated beyond the linear range of operation, then a polynomial or other approximation may be used instead. The parameters can be estimated during a calibration phase to get a model that is sufficiently accurate. The frequency of the digitally controlled oscillator can be calculated using:

$$f(V) = \frac{1}{2 \cdot \pi \sqrt{L \cdot C(V)}} \tag{10}$$

When varactors are used or when using a DAC in front of the varactor, then the frequency as a function of the three control voltages output by the DACs, 382, 388, 394, respectively $V_1$ (coarse), $V_2$ (medium), $V_3$ (fine), is given by:

$$f(V_1, V_2, V_3) = \frac{1}{2 \cdot \pi \sqrt{L \cdot (C(V_1) + C(V_2) + C(V_3))}} \tag{11}$$

With respect to the settings at the DAC inputs, equation (11) can be re-written as:

$$f(DACin_1, DACin_2, DACin_3) = \tag{12}$$
$$\frac{1}{2\pi \sqrt{L(C(DACin_1) + C(DACin_2) + C(DACin_3))}}$$

The product, LC, is a frequency contribution of the specific capacitor bank, and so equation (12) can be transformed into:

$$f(DACin_1, DACin_2, DACin_3) = \tag{13}$$
$$\frac{1}{\sqrt{\frac{1}{f_{center}^2} + \frac{1}{df_1(DACin_1)^2} + \frac{1}{df_2(DACin_2)^2} + \frac{1}{df_3(DACin_3)^2}}}$$

Hence, the settings for the DAC inputs for different target frequencies can be calculated or determined and corresponding DAC settings to be output by the DCO model to control the DACs are stored in the look up table of the model.

Figure 14:
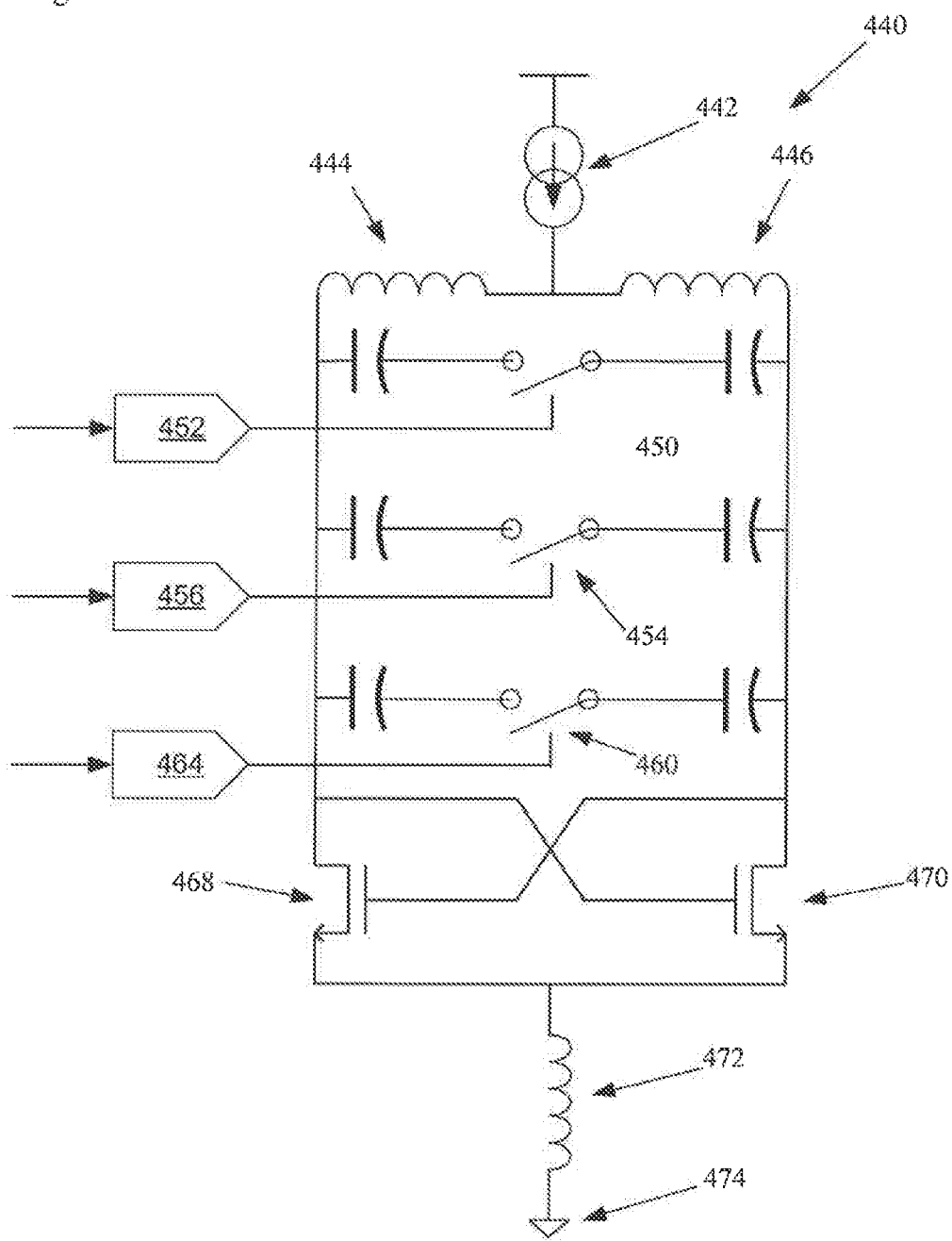
FIG. 14 shows a schematic block diagram of a second digitally controlled oscillator that may be used in the all digital phase locked loop system.

FIG. 14 shows a schematic block diagram of a second example digitally controlled oscillator 440 which may be used in the ADPLL system. The digitally controlled oscillator 440 may be particularly suitable for the ADPLL systems 270, 300, 320 illustrated in FIGS. 7, 8 and 9. Digitally controlled oscillator 440 is generally similar to digitally controlled oscillator 370 except that it uses banks of capacitors and electrically controllable switches controlled by encoders 452, 456, 464 to switch in different combinations of capacitors to vary the capacitances. A current source 442 is connected to a pair of inductors 444, 446, and a pair of transistors 468, 470 arranged similarly to those of FIG. 11, and connected via an inductor 472 to ground 474.

Digitally controlled oscillator 440 is implemented using capacitor banks and switches which provide voltage controlled capacitances. A first capacitor bank 450 includes unit capacitances of order 5 fF and can provide coarse frequency or PVT changes in the range of 5 to 10 MHz. A second capacitor bank 454 includes unit capacitances of order 500 aF and can provide medium, moderate or ACQ frequency changes in the range of 0.5 to 1.2 MHz. A third capacitor bank 460 includes unit capacitances of order 10 aF and can provide fine or TR frequency changes in the range of 15 to 50 kHz. The capacitances of the capacitor banks 450, 454, 460, the inductors and the transistors provide an adjustable frequency oscillator whose frequency of oscillation can be changed by varying the capacitance of the resonant parts of the circuit.

A first digital control signal from the DCO model may be supplied to the first encoder 452 to change the capacitance of the first capacitor bank 450 to provide coarse frequency control of the DCO 440. A second digital control signal from the DCO model may be supplied to the second encoder 456 to change the capacitance of the second capacitor bank 454 to provide medium frequency control of the DCO 440. A third digital control signal, e.g. from the signal combiner 292, may be supplied to the third encoder 464 to change the capacitance of the third capacitor bank 460 to provide fine frequency control of the DCO 440.

In other embodiments, the features of the digitally controlled oscillators 370 and 440 may be mixed and/or differently combined to provide other suitable digitally controlled oscillators.

A digitally controlled oscillator model for the DCO 440 of FIG. 14 can be implemented as follows. An accurate and fast model of the DCO is helpful for generating steep frequency ramps. Otherwise the model calculation may limit the steepness of the frequency ramp rather than user parameters such as frequency resolution of the ramp.

The DCO 440 is a LC-oscillator, whose frequency is determined by the three capacitor banks 450, 454, 460 and which each have different frequency resolutions. The first capacitor bank 450 (sometimes referred to as the PVT-bank) provides a tuning range with coarse steps. The steps of the second capacitor bank 454 (sometimes referred to as the acquisition bank—ACQ) maybe roughly $0.1 \ast df_{PVT}$, where $df_{PVT}$ is the frequency step size of the coarse or PVT bank 450, so that the ADPLL system 270 is able to lock properly. The system performance depends on the third capacitor bank 460 (sometimes referred to as the TR-bank) steps which may be of the order of 15 to 50 kHz. For a certain target frequency all three capacitor banks 450, 454, 460 may need to be set properly. The settings are not unique. To avoid tunings gaps and to cover the temperature drift of the DCO the capacitor banks are overlapping An accurate model of the DCO 440 can be particularly beneficial. The linearization of the feedback loop of the ADPLL 170 can be improved if less control needs to be done by the loop itself. It is also beneficial if the computational overhead is low. This can be achieved by using simpler calculations like addition and multiplication, and avoiding more complex calculations such as square root calculations which cost effort and calculation cycles.

If the matching of the individual capacitances within a capacitor bank to each other is accurate enough the frequency of the DCO 440 can be calculated using:

$$f_{DCO} = \frac{1 + tempCoeff \cdot \frac{T}{T_o}}{\sqrt{\frac{1}{f_{max}^2} + \left(\frac{1}{f_{pvt,min}^2} - \frac{1}{f_{max}^2}\right) \cdot \frac{pvt}{pvt_{max}} + \left(\frac{1}{f_{acq,min}^2} - \frac{1}{f_{max}^2}\right) \cdot \frac{acq}{acq_{max}} + \left(\frac{1}{f_{tr,min}^2} - \frac{1}{f_{max}^2}\right) \cdot \frac{tr}{tr_{max}}}} \quad (14)$$

Where pvt, acq and tr are the encoder settings for the first 450, second 454 and third 460 capacitor banks and $pvt_{max}$, $acq_{max}$ and $tr_{max}$ are the maximum encoder settings of the respective capacitor banks.

If the mismatch between the individual capacitances within a capacitor bank cannot be neglected, then the contribution of each individual capacitor can be take into consideration using the following expression:

$$f_{DCO} = \frac{1 + tempCoeff \cdot \frac{T}{T_o}}{\sqrt{\frac{1}{f_{max}^2} + \sum_i \left(\frac{1}{f_{pvt,min,i}^2} - \frac{1}{f_{max}^2}\right) \cdot pvt_i + \sum_j \left(\frac{1}{f_{acq,min,j}^2} - \frac{1}{f_{max}^2}\right) \cdot acq_j + \sum_k \left(\frac{1}{f_{tr,min,k}^2} - \frac{1}{f_{max}^2}\right) \cdot tr_k}} \quad (15)$$

Where the first sum is over the individual capacitors, of the first capacitor bank, the second sum is over the individual capacitors of the second capacitor bank and the third sum is over the individual capacitors of the third capacitor bank. The term $1+tempCoeff.T/T_o$ is a temperature correction term which includes a temperature coefficient, which can be determined empirically, multiplied by the current temperature T, divided by some characteristic temperature $T_o$.

Where equation (15) to be used to calculate the individual capacitor values for a certain DCO frequency, $f_{DCO}$, then this may take a significant time in a hardware implementation or a software implementation. In some circumstances, for a particularly steep frequency ramp, the model calculation might limit the steepness which the ADPLL system can handle. Hence, in some circumstances, the computational burden can be reduced by calculating the squared reciprocal value on both sides, resulting in the expression:

$$\frac{1}{f_{DCO}^2} = \frac{\frac{1}{f_{max}^2} + \sum_i \left(\frac{1}{f_{pvt,min,i}^2} - \frac{1}{f_{max}^2}\right) \cdot pvt_i + \sum_j \left(\frac{1}{f_{acq,min,j}^2} - \frac{1}{f_{max}^2}\right) \cdot acq_j + \sum_k \left(\frac{1}{f_{tr,min,k}^2} - \frac{1}{f_{max}^2}\right) \cdot tr_k}{\left(1 + tempCoeff \cdot \frac{T}{T_o}\right)^2} \quad (16)$$

If the temperature is known then the temperature dependent term can be shifted to the left hand side, to give:

$$\tau^2 = \frac{1}{f_{max}^2} + \sum_i \left(\frac{1}{f_{pvt,min,i}^2} - \frac{1}{f_{max}^2}\right) \cdot pvt_i + \sum_j \left(\frac{1}{f_{acq,min,j}^2} - \frac{1}{f_{max}^2}\right) \cdot acq_j + \sum_k \left(\frac{1}{f_{tr,min,k}^2} - \frac{1}{f_{max}^2}\right) \cdot tr_k \quad (17)$$

where $$\frac{\left(1 + tempCoeff \cdot \frac{T}{T_o}\right)^2}{f_{DCO}^2} = \tau^2 \quad (18)$$

As $\tau^2$ is known the calculation of the settings for the first, second and third capacitor banks can be obtained from a simple linear search algorithm, or derived from a look-up table or by linear interpolation of values stored within a look-up table, in case of good matching between the capacitances of the individual capacitors in a capacitor bank. Interpolation of values stored in a look-up table, may reduce the size of the look up table and hence may reduce the chip area used for the look up table.

The $f_{pvt,i}$, $f_{acq,j}$ and $f_{tr,k}$ values can to be determined by a calibration process during startup of the ADPLL system 270 or stored in a memory after production test of the ADPLL system 270.

Further parameters which might be taken into consideration to improve the accuracy of the DCO model are mismatch of the individual capacitors in the capacitor banks and/or amplitude response of the DCO 440 as a function of frequency. If the amplitude of the DCO 440 output signal, f_out, is a function of frequency then it can happen that the fdco for each of the first, second and third capacitor banks get distorted so that the moment does not fit. In this case a parabolic function, for example, can be added as further factor equivalent to the temperature behavior that compensates the mismatch. The parameters of the parabolic function can be determined from measurements or simulation via regression analysis.

Figure 15:
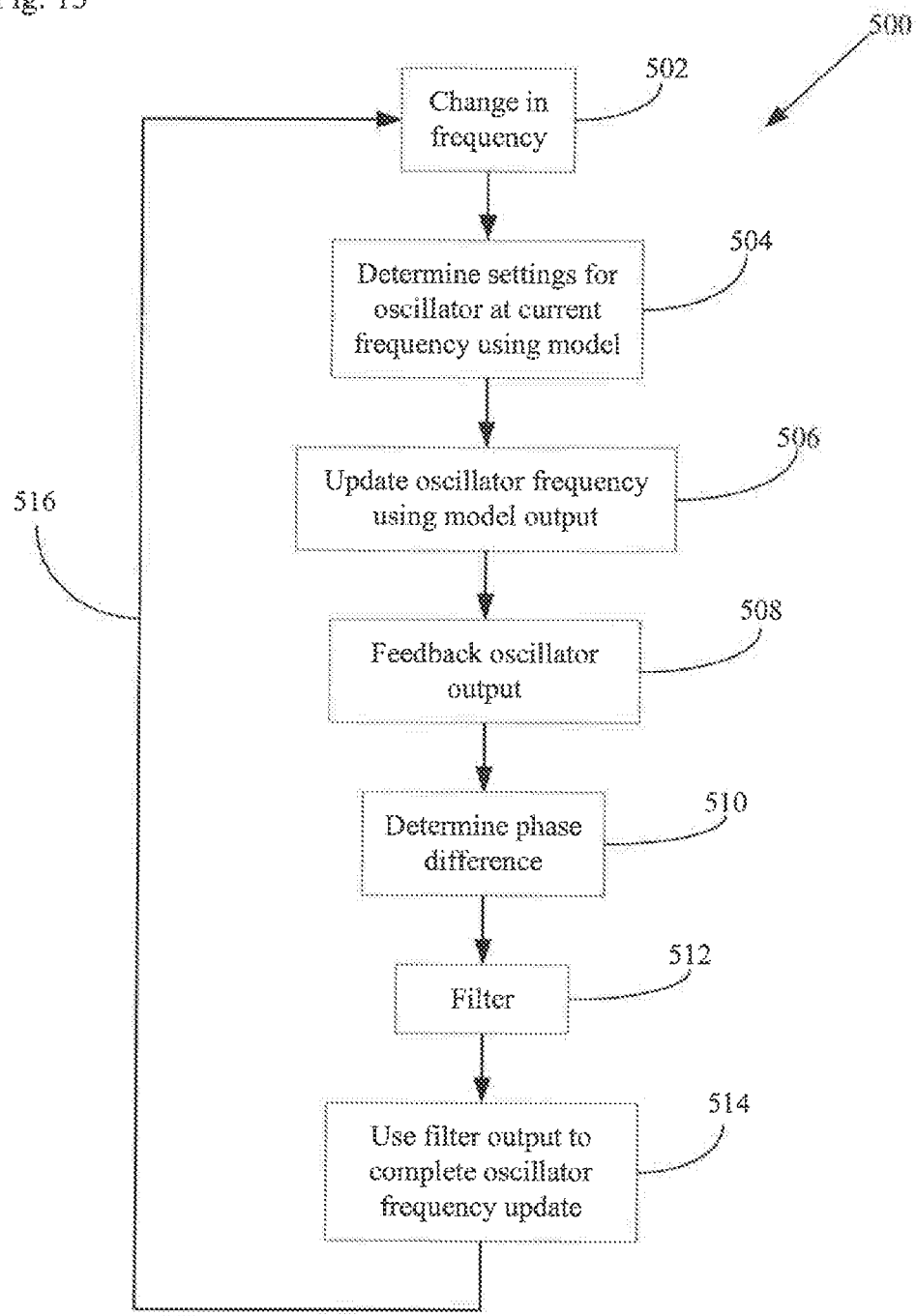
FIG. 15 shows a flow chart illustrating an example method of operation of the all digital phase locked loop system.

FIG. 15 shows a flow chart illustrating the general method of operation 500 of the ADPLL systems 160, 220, 270, 300, 320 during a particular frequency ramp cycle. At 502 a change in target frequency occurs, for example by a next FCW being output by the frequency ramp generator. A signal indicative of the current target frequency is fed forward to the DCO model and at 504, the DCO model is used to determine settings for the DCO to change the DCO frequency to be closer to the current target frequency. At 506 one or more control signals are output by the DCO model and are directly or indirectly used, for example by combination with control signals output by the filter, to update the oscillator frequency to closer match the current target frequency. A portion of the signal output by the DCO is fed back by the ADPLL 170 at 506 to the phase difference detector which compares the phase of the output signal, f_out, with the phase of the current target frequency. As the frequency of f_out is already closer to the target frequency, the phase difference detected is small. The loop filter then filters the detected phase difference and outputs a control signal to further vary the frequency of the DCO at 514 to be closer to the target frequency. The method repeats as illustrated by process flow return line 516 so that the DCO output signal frequency, f_out, matches the target frequency. On a next clock cycle of the frequency ramp, a next FCW is added to the target frequency, and the current target frequency changes and the method 500 generally repeats to follow the frequency ramp.

From a control engineering perspective, there is a ramp generator which acts as an integrator and integrates the frequency control word (FCW). This provides the transition from the frequency domain to the phase domain. The feedback loop divider 188 and TDC (time to digital converter) 190 also generate a ramp from the DCO frequency. The offset between the ramps is the phase difference and which is taken as control information by the loop filter 182 and the digitally controlled oscillator 186. When the phase locked loop 170 is settled there might remain a phase offset different from zero due to some mismatch, delay, etc. The loop 170 is considered to be in lock in when the offset becomes constant or zero in particular cases. The loop filter 182 together with the phase detector 180 gain, $k_d$, and oscillator 186 gain, $k_e$, defines the dynamic loop characteristic.

Although described and illustrated in a serial manner in FIG. 15, it will be appreciated that some of these operations will effectively happen in parallel within the ADPLL system, unless the context requires otherwise.

The ADPLL system including a model of the DCO may have a number of benefits compared to other approaches to tracking variable frequency signals.

An analogue or digital PLL with a feedback divider in which the divider ratio is modulated according to the frequency ramp could be used. However, the linearity and maximum steepness of the frequency ramp will depend on applied loop parameters and the linearity of the implemented components, for example the voltage controlled oscillator (VCO). The steepness of the frequency ramp is limited by the possible tracking speed of the PLL which is defined by the loop parameters. This would limit the possible resolution of a radar system in the case of the rising and falling speed of the chirp being identical. Also, if the fly back or reset part of the chirp is faster than the operation part of the chirp, then the fly back/reset speed impacts on the repetition speed of the chirp signal.

Furthermore, there is always a settling interval when the ramp is starting again. During settling the ramp is distorted and therefore is not linear. The settling interval reduces the interval of the chirp signal that can be used for the radar application itself. It is also possible to increase the bandwidth during the reset interval of the chip. However, this would introduce disturbances if done in an analog system. In a digital PLL system this can be solved by pre-charging of the loop filter and such a mechanism can be applied.

If very fast chirps are required. e.g. with large df/dt and a high repetition frequency of, e.g., 1 MHz, then this would require a very fast loop. Depending on the loop configuration, the implemented elements and their noise contribution, it is possible that the quantization noise of the phase detector dominates the phase noise of the loop. In order to minimize this contribution the bandwidth of the feedback loop needs to be reduced which would limit the steepness of the chirp. Therefore in this approach there would need to be a compromise between the dynamic features of the chirp and the phase noise requirements.

This dependency can be eliminated by using a suitable model of the DCO which predicts and presets the frequency of the oscillator. As explained above, chirp generation, e.g. for radar application, may be accelerated by using a model of the DCO in a ADPLL system. The chirps can be accelerated by a model for the DCO which allows presetting of the DCO to the required frequencies and at the same time provides greater freedom in the loop parameter settings, e.g. to meet the phase noise requirements of the system. The tracking speed of the loop is then limited only by the accuracy of the DCO model.

In some embodiments, some or all of the ADPLL system 160, 220, 270, 300, 320, 400 may be implemented in software or hardware or a combination thereof. When implemented in hardware some or all of the ADPLL system may be provided as a semi-conductor integrated circuit in a package including a lead frame.

As noted above the ADPLL system is particularly suited for used in a CW radar system. However, the ADPLL system has a broader range of application and may also be used in tuners for radio (e.g., AM, FM, DAB, DAB+, DAM, etc.), satellite radio, televisions, car intelligent traffic systems (ITS), Ethernet transceivers, Bluetooth or Bluetooth LE applications and many more.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. An all digital phase locked loop system for providing a variable frequency output signal which tracks a variable frequency input signal, comprising:
 a digital phase locked loop, including a digitally controlled oscillator having an output arranged to provide a variable frequency output signal; and
 a model of the digitally controlled oscillator, wherein the model represents the behavior of the digitally controlled oscillator as a function of frequency, the model having a model input arranged to receive a signal indicating a current target frequency of a variable frequency input signal, wherein the model of the digitally controlled oscillator is configured to output at least one control signal to control the frequency of the digitally controlled oscillator to be closer to the current target frequency and wherein the digital phase locked loop is configured to control the digitally controlled oscillator to reduce any difference between the frequency of the digitally controlled oscillator and the current target frequency arising from any deviation of the model of the digitally controlled oscillator from the digitally controlled oscillator for the current target frequency, wherein the at least one control signal includes a frequency modulation scheme and the current target frequency is calculated according to the frequency modulation scheme.

2. The all digital phase locked loop system as claimed in claim 1, wherein the digital phase locked loop includes a filter and wherein the at least one control signal is arranged to modify an output signal of the filter to control the frequency of the digitally controlled oscillator.

3. The all digital phase locked loop system as claimed in claim 1, wherein the at least one control signal is supplied to the digitally controlled oscillator to control the frequency of the digitally controlled oscillator.

4. The all digital phase locked loop system as claimed in claim 1, wherein the model is configured to output a plurality of control signals comprising a first control signal providing coarse control, a second control signal providing moderate control and a third control signal providing fine control.

5. The all digital phase locked loop system as claimed in claim 4, wherein the phase locked loop includes a filter and the first, second and third control signals are arranged to modify respective first, second and third output signals of the filter to control the frequency of the digitally controlled oscillator.

6. The all digital phase locked loop system as claimed in claim 4, wherein the phase locked loop includes a filter and the first and second control signals are supplied to the digitally controlled oscillator to control its frequency and the third control signal is arranged to modify an output signal of the filter to control the frequency of the digitally controlled oscillator.

7. The all digital phase locked loop system as claimed in claim 1, wherein the digitally controlled oscillator includes a plurality of variable capacitance elements and wherein the at least one control signal is used to change the capacitance of the variable capacitance elements to change the frequency of the digitally controlled oscillator.

8. The all digital phase locked loop system as claimed in claim 7, wherein the plurality of variable capacitance elements are capacitor banks and the model is configured to implement a model of a digitally controlled oscillator including a plurality of capacitor banks each having a different frequency resolution.

9. The all digital phase locked loop system as claimed in claim 1, wherein the model includes at least one look up table.

10. The all digital phase locked loop system as claimed in claim 1, wherein the model is further configured to interpolate between a first value and a second value of the current target frequency.

11. The all digital phase locked loop system as claimed in claim 1, wherein the phase locked loop includes a filter and wherein the filter is configured to output a pre-set value when a transition between a rising and a falling, or a falling and a rising, frequency ramp signal is detected.

12. The all digital phase locked loop system as claimed in claim 1, wherein the phase locked loop includes a filter and wherein the model is configured to update values stored in the model based on one or more signals output from the filter.

13. A package comprising a lead frame and a semi-conductor integrated circuit, wherein the semi-conductor integrated circuit is configured to provide the all digital phase locked loop system of claim 1.

14. A continuous wave radar system including:
a variable frequency oscillator arranged to drive a transmission antenna; and
a modulation circuit arranged to supply a frequency modulation signal to modulate the frequency of the variable frequency oscillator, wherein the modulation circuit includes an all digital phase locked loop system as claimed in claim 1.

15. A method for providing a variable frequency output signal which tracks a variable frequency input signal, comprising:
supplying a signal indicating a current target frequency for the variable frequency input signal to a model of a digitally controlled oscillator;
generating at least one control signal using the model of the digitally controlled oscillator;
using the control signal to control the frequency of a digitally controlled oscillator forming part of a phase locked loop to be closer to the current target frequency; and
using the phase locked loop to further control the frequency of the digitally controlled oscillator to reduce any differences between the frequency of the digitally controlled oscillator and the target frequency arising from any deviations of the model of the digitally controlled oscillator form the digitally controlled oscillator for the current target frequency, wherein the at least one control signal includes a frequency modulation scheme and the current target frequency is calculated according to the frequency modulation scheme.

* * * * *